United States Patent [19]

Peters et al.

[11] 4,265,932
[45] May 5, 1981

[54] MOBILE TRANSPARENT WINDOW APPARATUS AND METHOD FOR PHOTOCHEMICAL VAPOR DEPOSITION

[75] Inventors: John W. Peters, Malibu; Frank L. Gebhart, Long Beach, both of Calif.

[73] Assignee: Hughes Aircraft Company, Culver City, Calif.

[21] Appl. No.: 63,213

[22] Filed: Aug. 2, 1979

[51] Int. Cl.³ .............................................. B05D 3/06
[52] U.S. Cl. ................................. 427/53.1; 118/50.1; 118/620; 118/718; 118/725; 427/54.1
[58] Field of Search ................ 118/70, 50.1, 620, 725, 118/641, 718, 642; 427/53.1, 54.1; 250/237 R, 431, 433, 482, 513

[56] References Cited

U.S. PATENT DOCUMENTS

| | | | |
|---|---|---|---|
| 3,139,352 | 6/1964 | Coyner | 427/248 |
| 3,383,238 | 5/1968 | Unzicker et al. | 427/54.1 |
| 3,620,827 | 11/1971 | Collet | 427/54.1 |
| 3,740,257 | 6/1973 | Roscher | 427/45 |
| 3,799,792 | 3/1974 | Ryng | 427/248 |
| 4,022,928 | 5/1977 | Piwcyzk | 427/43.1 |

*Primary Examiner*—John H. Newsome
*Attorney, Agent, or Firm*—Mary E. Lachman; W. H. MacAllister

[57] ABSTRACT

The specification discloses a mobile transparent window apparatus and method for use in a photochemical vapor deposition system having a reaction chamber with a quartz window integral with the top surface thereof, which prevents undesirable deposits on the quartz window and thereby enhances the efficiency and rate of the deposition process. The apparatus comprises: (a) a film of a predetermined material that is drawn across the internal face of the quartz window within the reaction chamber, the predetermined material being characterized by being transparent to a selected wavelength of radiation, being stable at the elevated temperature required for the photochemical vapor deposition, and possessing sufficient mechanical strength to be moved across the quartz window; and (b) means for moving the film across the internal face of the quartz window.

9 Claims, 3 Drawing Figures

MOBILE TRANSPARENT WINDOW APPARATUS AND METHOD FOR PHOTOCHEMICAL VAPOR DEPOSITION

The Government has rights in this invention pursuant to Contract No. F33615-78-C-5049 awarded by the Department of the Air Force.

TECHNICAL FIELD

This invention relates generally to an apparatus and a method for the photochemical vapor deposition of a layer of a selected material, and, more particularly, to an apparatus and method for the photochemical vapor deposition of a layer of silicon nitride.

BACKGROUND ART

In the fabrication of semiconductor integrated circuits and devices, a layer of silicon nitride ($Si_3N_4$) is often used as a passivation layer to prevent contamination of the device by air, moisture, mobile ions, and other impurities which might cause corrosion and degredation of device performance. A silicon nitride layer may also be used as a mask during such processes as ion implantation, ion diffusion, and metal deposition.

Silicon nitride layers have been prepared using a photochemical reaction, i.e. a chemical reaction which is induced or initiated by radiation. One process for depositing a $Si_3N_4$ layer uses a photosensitized reaction between silane ($SiH_4$) and hydrazine ($N_2H_4$), as discussed by M. G. Collet, in the article entitled "Depositing Silicon Nitride Layers at Low Temperature Using a Photochemical Reaction," in the Journal of the Electrochemical Society: SOLID STATE SCIENCE AND TECHNOLOGY, Vol. 116, No. 1, January 1969, pages 110-111. In such a process, mercury (Hg) is excited by radiation of a particular wavelength (2537 Angstroms) to form mercury in an excited state ($Hg^*$). The $Hg^*$ then collides with the $SiH_4$ and the $N_2H_4$ to cause these molecules to form radicals which then react to form $Si_3N_4$. Further studies of this process, as well as of a fast-flow system which uses a mixture of $SiH_4$ and ammonia ($NH_3$), are reported by C. H. J. v. d. Brekel and P. J. Severin, in an article entitled "Control of the Deposition of Silicon Nitride Layers by 2537 Å Radiation," in the Journal of the Electrochemical Society: *SOLID STATE SCIENCE AND TECHNOLOGY*, Vol. 119, No. 3, March 1972, pages 372-376.

In order to improve upon the films prepared in accordance with the teachings of the above references, since these films were found to have a high incidence of pinholes, a process for the preparation of low temperature photonitride films of high quality and free of chemically bonded oxygen was discovered and set forth in copending application Ser. No. 910,704, assigned to the present assignee now U.S. Pat. No. 4,181,751 classified 427/94. By the process of the latter invention, a silane getter technique is used to remove oxygen and moisture from the nitrogen-containing reactants, in conjunction with a mercury vapor photosensitized reaction of a predetermined vapor mixture of silane, ammonia, and hydrazine at temperatures from 100° C. to 300° C.

In the above prior art processes, however, the photochemical vapor deposition process is initiated by the transmission of ultraviolet radiation (2537 Å) through a quartz window which forms the top of the vacuum deposition chamber. During the deposition process, the quartz window also becomes coated with the deposited material (e.g., silicon nitride). This coating thus diminishes the transparency of the window, which diminishes the amount of radiation which can enter the deposition chamber to initiate the photochemical reaction, and thus impedes the rate of deposition. It is the alleviation of this problem of diminished window transparency to which the present invention is directed.

Certain vacuum systems, such as for the deposition of aluminum, have used a window assembly comprising a clear Teflon film that is manually advanced in order to permit the operator to visually monitor the deposition as it occurs in the chamber. Such a system is described in the catalog of AIRCO Temescal of Berkeley, California, entitled "Viewvac Viewing Ports Model VV400." In such a system, the window is provided for convenience and is not an integral part of the deposition reactions and process.

SUMMARY OF THE INVENTION

The general purpose of this invention is to provide a new and improved apparatus and method for the photochemical vapor deposition of a layer of a selected material on the surface of a chosen substrate which possesses most, if not all, of the advantages of the above prior art photochemical vapor deposition processes and apparatuses, while overcoming their above-mentioned significant disadvantages.

The above general purpose of this invention is accomplished by a photochemical vapor deposition apparatus comprising: (a) a reaction chamber with a quartz window integral with the top surface thereof for the transmission of a selected wavelength of radiation through the quartz window into the reaction chamber; (b) a film of predetermined material that is movable across the internal face of the quartz window within the reaction chamber, the predetermined material being characterized by being transparent to the selected wavelength of radiation, being stable at the elevated temperature required for photochemical vapor deposition, and possessing sufficient mechanical strength to be moved across the quartz window; (c) means for moving the film across the internal face of the quartz window; (d) means for introducing a reactant gas mixture into the reaction chamber; (e) means for heating the substrate within the reaction chamber; (f) means for producing radiation of the selected wavelength and introducing this radiation into the reaction chamber through the quartz window; (g) means for producing a vacuum in the reaction chamber of sufficiently low pressure to enable the deposition to occur. The film placed at the internal face of the quartz window during the deposition process prevents undesirable or extraneous deposits of the selected material on the internal face of the quartz window. The movement of the film across the internal face of the quartz window removes the selected material deposited on the film from close proximity to the internal face of the window. Thus, the window is maintained in a clean and transparent state and the efficiency and rate of the deposition is enhanced.

Accordingly, it is an object of the present invention to provide a new and improved photochemical vapor deposition apparatus which enhances the efficiency of the deposition process.

Another object is to provide an apparatus of the type described which significantly increases the rate at which a selected material may be deposited on a substrate.

Still another object is to provide an apparatus of the type described which prevents deposition of the selected material on the internal face of the quartz window.

A further object of the present invention is to provide an apparatus of the type described which maintains the quartz window in a clean and transparent state throughout an extended period required for the deposition process.

Another object is to provide a new and improved apparatus of the type described which permits the uniform and high quality deposition of a desired material on a substrate.

Yet another object of the present invention is to provide a new and improved photochemical vapor deposition method which minimizes the resistance to the transmission of reaction-inducing radiation caused by extraneous deposition products and thus maximizes the efficiency and rate of the vapor deposition reaction.

The foregoing and other objects and advantages of the present invention will be apparent from the following more particular description of the preferred embodiments of the invention, as illustrated in the accompanying drawings.

DETAILED DESCRIPTION OF THE INVENTION

Figure 1:
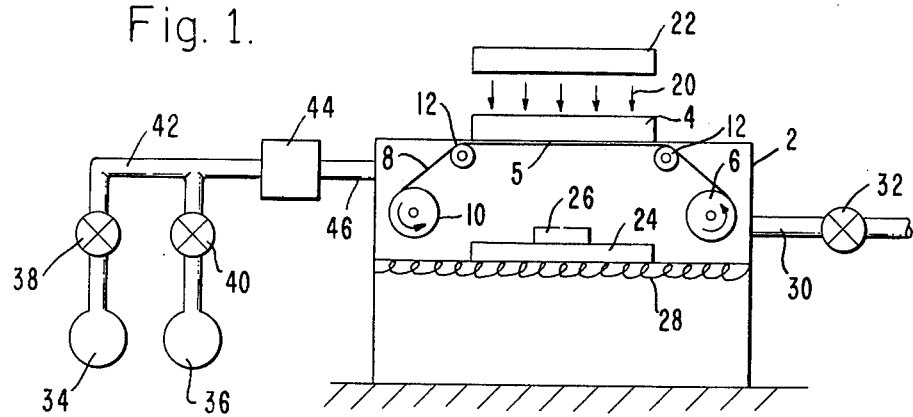
FIG. 1 is a schematic diagram of a photochemical vapor deposition system incorporating the mobile transparent window apparatus of the present invention.

FIG. 1 shows, in simplified form, a photochemical vapor deposition system incorporating the mobile transparent window apparatus of the present invention. The reaction chamber 2 has a quartz window 4 integral with the top surface of the reaction chamber. The the quartz window 4 is transmissive to the selected wavelength of radiation used to initiate the desired photochemical reaction, and this radiation 20 is produced by the radiation-producing means 22 which may be, for example, an array of low pressure mercury vapor arc lamps. Within the reaction chamber 2, the feed roll 6, which is positioned at one end of the quartz window 4, holds a roll of film 8 of a predetermined material. This material is selected to be transparent to the selected wavelength of radiation used to initiate the desired photochemical reaction, is stable at the elevated temperature required for deposition, and has sufficient mechanical strength to be moved across the internal face 5 of the quartz window 4 within the chamber 2 without tearing or being damaged. In the embodiment of the invention shown in FIG. 1, the film 8 passes from the feed roll 6, over a guide mechanism 12 which is positioned in close proximity to the internal face 5 of the quartz window 4 and to the extreme ends of the quartz window 4. The guide mechanism 12 may consist of rollers as shown in FIG. 1, and provides the optimal spacing, including contact, between the internal face 5 of the quartz window 4 and the adjacent surface of the film 8 in order to allow free movement of the film 8 across the face 5 and at the same time to minimize the deposition of reaction products on the face 5 of the quartz window 4. The film 8 passes over the guide mechanism 12, to the take-up roll 10 which is positioned at the end of the quartz window 4 opposite the feed roll 6.

Attached to the take-up roll 10, there is a means for transmitting rotary motion thereto. For example, a shaft (not shown) may be connected at one end to the take-up roll 10 and at the opposite end to a motor (not shown) that is external to the reaction chamber 2, with the shaft passing through a rotary vacuum seal at the external surface of the reaction chamber 2. During the deposition process, the motor is activated and rotates the shaft. The shaft then rotates the take-up roll 10, which moves or draws the film 8 from the feed roll 6 across the guide mechanism 12, which causes the film to pass smoothly over the internal face 5 of the quartz window 4 and with optimal spacing in relation thereto, but with minimized friction. The film is then drawn onto take-up roll 10. Other means for transmitting the necessary rotary motion to the take-up roll 10, such as a magnetic coupling system, may be used in place of the rotating shaft described above.

Within the reaction chamber 2, there is a substrate holder 24, which holds the substrate 26 onto which a layer of a selected material is to be deposited. External to the reaction chamber 2 at the bottom surface are heating elements 28 which are used to heat the substrate 26 to the required temperature so that appropriate film properties, such as density, may be obtained. Leading from the reaction chamber 2 is a tube 30 which passes through a valve 32 and then to a vacuum-producing means (not shown).

External to the reaction chamber 2 are chambers 34 and 36 which contain the individual reactant gases for the selected photochemical reaction, for example, silane and ammonia. The chambers 34 and 36 are connected to the valves 38 and 40, respectively, which are used to control the amounts of reactants which are introduced into the tube 42. The reactant gases flow through the tube 42 into the chamber 44 which contains a pool of mercury having mercury vapor above it. The reactant gases thus become mixed with mercury vapor and this reactant gas mixture then passes through the tube 46 into the reaction chamber 2, where the photochemical reaction may be brought about.

The components of the apertures shown in FIG. 1 may be constructed of stainless steel or aluminum unless otherwise specified.

By having the film 8 positioned with optimal spacing from the internal face 5 of the quartz window 4, reactant gases are kept out of contact with the face 5 and an extraneous and unwanted deposit deos not form on the face 5 of the quartz window 4. A deposit does, however, form on the face of the film 8 which is exposed to reactant gases. The portion of the film 8 which has the deposit formed thereon is continuously drawn across the internal face 5 of the quartz window 4 and is wound onto the take-up roll 10. Thus, the deposit formed on the film 8 is continuously removed from the proximity of the quartz window 4. As a result, the internal face 5 of the quartz window 4 is maintained in a continuously clean and transparent state, and the accumulation of deposition products on the face 5 which are opaque to reaction-inducing radiation and would attenuate, absorb, or provide a resistance to the radiation entering the deposition chamber through window 4 has been avoided. Since the rate of deposition is directly proportional to the intensity of the radiation passing through the quartz window 4, maintaining the internal face 5 of quartz window 4 in a clean and transparent state significantly increases the rate of deposition. By use of the apparatus described above, the internal face 5 of the quartz window 4 is maintained in a continuously clean and transparent state to thereby enhance the efficiency of the deposition process.

Figure 2:
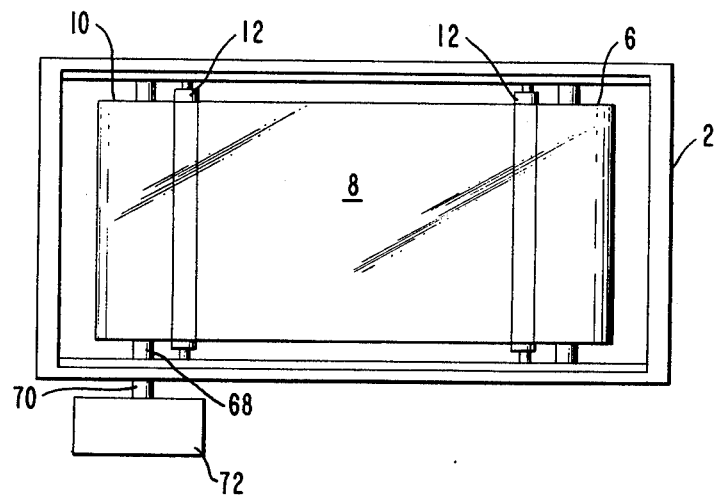
FIG. 2 is a plan view of the mobile transparent window apparatus shown in FIG. 1.

FIG. 2 shows a plan view of the mobile transparent window apparatus which is attached to chamber 2 as illustrated in FIG. 1. The feed roll 6 is positioned at one end of the quartz window 4 (not shown in FIG. 2), and the take-up roll 10 is positioned at the opposite end of the quartz window 4. Between the feed roll 6 and the take-up roll 10 is the guide mechanism 12 that is positioned at opposite ends of the quartz window 4. The shaft 68 of the take-up roll 10 is connected to the shaft 70 which is external to the reaction chamber 2 and passes through a rotary vacuum seal (not shown) at the external surface of the reaction chamber 2. The shaft 70 is connected to the motor 72 which, when activated, causes rotation of the shaft 68 of the take-up roll 10, to draw the film 8 from the feed roll 6 onto the take-up roll 10.

Figure 3:
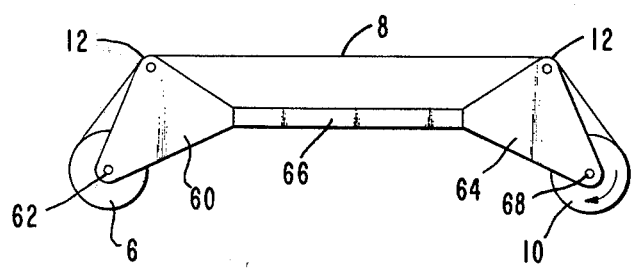
FIG. 3 is a schematic diagram of one alternative embodiment of the present invention.

Turning now to FIG. 3, there is shown a self-contained mobile transparent window apparatus for use with a photochemical vapor deposition system having a reaction chamber with a quartz window integral with the top surface of the chamber. The components of the apparatus of FIG. 3 are similar to those of the apparatus of FIG. 2, comprising the film 8, the feed roll 6, the take-up roll 10, and the guide mechanism 12. A substrate holder 66, which holds the substrate on which deposition is performed, is attached, at one end, by support plate 60 to the shaft 62 of the feed roll 6 and to the adjacent guide mechanism 12 and, at the opposite end, by a second support plate 64 to the shaft 68 of the take-up roll 10 and to the adjacent guide mechanism 12. The support plates 60 and 64 and the substrate holder 66 are made of stainless steel and form the frame for the cassette-type construction. Alternatively, the self-contained mobile transparent window apparatus may be constructed without the substrate holder 66, but with support plates 60 and 64 shown in FIG. 3. In this latter case, the substrate holder is permanently affixed within the deposition reaction chamber being used. Using this cassette, either with or without the substrate holder, the apparatus of FIG. 3 is positioned within the reaction chamber prior to the deposition process so that the film 8 has optimal spacing from the internal face 5 of the quartz window 4 as shown in FIG. 1. The take-up roll 10 is connected to a means for providing rotary motion thereto. The apparatus of FIG. 3 then functions as described in relation to FIG. 1.

When the film 8 contained on the feed roll 6 has been exhausted, the cassette can be removed and replaced with a new cassette. The cassette is constructed so that its dimensions correspond to the dimensions of the quartz window of the reaction chamber being used and so that the film 8 achieves its proper position in relation to the internal face 5 of the quartz window 4 as described in relation to FIG. 1. Whereas the transparent window apparatus shown in FIG. 1 is permanently attached to the reaction chamber, the transparent window apparatus shown in FIG. 3 is self-contained and may be removed and replaced within the reaction chamber.

EXAMPLE 1

Using the apparatus described in FIG. 1, a layer of silicon nitride was photochemically deposited on a silicon substrate by the reaction of silane, ammonia, and mercury vapor. The source 22 of the ultraviolet radiation 20 shown in FIG. 1 was an array of low pressure mercury vapor arc lamps which produce radiation having a wavelength of 2537 Å. The film 8 used was polyvinylidene fluoride having a thickness of 25 micrometers and obtained from the Kureha Corporation America, 420 Lexington Avenue, New York, New York. Polyvinylidene fluoride is particularly suited for use in the photochemical vapor deposition of silicon nitride since polyvinylidene fluoride exhibits high transmission (i.e. greater than 95%) at the 2537 Å initiating radiation, is stable up to 200° C., is flexible, and does not exude contamination under vacuum operating conditions. Using a photochemical vapor deposition process similar to that described in the afore-mentioned copending application Ser. No. 910,704, assigned to the present assignee, with the optional omission of the silane pretreatment of ammonia, the reaction chamber 2 was evacuated to a pressure of $10^{-3}$ Torr and the heating elements 28 were activated to heat the substrate 26 to a temperature of 150° C. The motor attached to the shaft of the take-up roll 10 was activated and the film 8 was drawn across the internal face 5 of the quartz window 4.

It has been found that the uniformity of the deposition can be enhanced by placing the feed roll at the end of the reaction chamber which is opposite to the point at which the reactant gases enter the chamber. Assuming that the deposition is uniform at all points within the reaction chamber, it would follow that the deposit on a unit area of the moving film at any given time would vary directly with the distance of that unit area from the feed roll if the feed roll is placed near the point where reactant gases enter. The deposit on a unit area which has traversed the length of the reaction chamber would be heavier than that of a unit area being just drawn off the feed roll. It has also been experimentally observed that the deposition rate is not constant at all points within the reaction chamber, but rather decreases approximately linearly with the distance from the inlet for the reactant gases, due to the depletion of reactant gases. Therefore, running the film in a direction to which is counter to the direction of the reactant gas flow places the film of highest ultraviolet transparency (i.e., least deposition on the film) in the region of the reaction chamber having the lowest deposition rate in the absence of the film. Thus, the uniformity of the deposition is enhanced.

Using the apparatus and procedure just described, a layer of silicon nitride was deposited on a silicon substrate at the rate of 6,000 Å per hour. By comparison, the deposition rate of the prior art processes discussed above is typically 1,000 Å in 30 minutes and increases only to a total of 1200 Å if the deposition process is continued for a total period of one hour. Thus, the significant increase in deposition rate which can be achieved by using the apparatus of the present invention is manifest. In addition, the process of the present invention avoids the prior art leveling-out problem in which the amount of material deposited decreases significantly with extended processing time periods.

While the present invention has been particularly described with respect to the preferred embodiments thereof, it will be recognized by those skilled in the art that certain modifications in form and detail may be made without departing from the spirit and scope of the invention. In particular, the scope of the invention is not limited to the photochemical vapor deposition of silicon nitride, but is intended to include any process in which radiation is introduced into a reaction chamber through a transparent window. In addition, the material of which the film is made may be selected as required in order to provide a film that is transparent to the wavelength of radiation necessary to initiate the desired photochemical reaction. It is not intended to limit the means for moving the film in relation to the window to the particular means described herein, but rather it is intended to include other means for moving film that may be apparent to one having skill in the pertinent art. Further, while a quartz reaction chamber window has been discussed, the reaction chamber window may be made of any material which is suitable for the desired photochemical reaction process. The dimensions of the mobile transparent window apparatus described herein may be varied as required in order to correspond to the dimensions of the reaction chamber being used.

Furthermore, it is not intended to limit the method of the present invention to the particular apparatus described, but rather it is intended to include any method for passing radiation to a predefined enclosed region or chamber in which a photochemical vapor deposition reaction is produced, which provides continuous relative movement between a selected radiation-transmissive film and a window adjacent the enclosed region to minimize the resistance to the transmission of the radiation caused by unwanted or extraneous deposition of reaction products in proximity to the window. In addition, the present invention is not limited to a process and apparatus which moves the selected film across the reaction chamber window, but includes any process and apparatus in which there is continuous relative movement between the film and the window. For example, a cylindrical, windowed chamber which is rotated with respect to a stationary film for the purposes set forth herein is intended to be within the scope of the present invention. Finally, it is also intended to include within the scope of the present invention, a method for depositing a layer of a selected material on a substrate or target in a predetermined pattern, such as lines or stripes, rather than as a continuous film. Such deposition of a patterned layer would require that the initiating radiation for the photochemical reaction be caused to strike only selected portions of the substrate or target on which it is desired to form a deposit. The radiation could be focused on selected portions of the target or the radiation could be passed through a mask, such as a stainless steel mask placed over the target within the reaction chamber, to cause the radiation to strike selected portions of the target. Optionally, laser radiation of the appropriate wavelength could provide the required limited and directed radiation for depositing such a patterned layer.

We claim:

1. Apparatus for the photochemical vapor deposition of a layer of a selected material on the surface of a chosen substrate comprising:
   (a) a reaction chamber having a quartz window integral with the top surface thereof, for the transmission of a selected wavelength of radiation therethrough into said reaction chamber;
   (b) a film of predetermined material that is movable across the internal face of said quartz window within said reaction chamber, said predetermined material being transparent to said selected wavelength of radiation, stable at the elevated temperature required for said deposition, and possessing sufficient mechanical strength to be moved across said quartz window;
   (c) means affixed within said reaction chamber for moving said film across said internal face of said quartz window;
   (d) means external to said reaction chamber and associated therewith for introducing a reactant gas mixture into said reaction chamber;
   (e) means located within said reaction chamber for heating said substrate;
   (f) means external to said reaction chamber for producing radiation of said selected wavelength and introducing said radiation into said reaction chamber through said quartz window; and
   (g) means external to said reaction chamber for producing a vacuum in said reaction chamber of sufficiently low pressure to enable said deposition to occur, whereby said film at said internal face of said quartz window during the deposition process prevents undesirable deposits of said selected material on said internal face of said quartz window and said moving of said film across said internal face removes said selected material deposited on said film from close proximity to said internal face, thereby maintaining said window in a clean and transparent state and enhancing the efficiency of said deposition.

2. The apparatus set forth in claim 1 wherein said means for moving said film across said internal face of said quartz window further comprises:
   (a) a feed roll at a first end of said quartz window to feed said film across said window;
   (b) a take-up roll at a second end of said quartz window opposite said first end, to take up said film which has been moved across said window;
   (c) a guide mechanism intermediate to said feed roll and said take-up roll and in close proximity to said internal face of said quartz window and to said first and said second ends of said quartz window, to cause said film to pass smoothly over said internal face of said quartz window and with optimal spacing therewith, but with minimized friction; and
   (d) a shaft connected at one end to said take-up roll and at the opposite end to a motor that is external to said reaction chamber, said shaft passing through a rotary vacuum seal at the external surface of said reaction chamber, whereby activation of said motor rotates said shaft, and said shaft rotates said take-up roll to draw said film from said feed roll across said internal face of said quartz window.

3. The apparatus set forth in claim 1 wherein:
   (a) said selected material deposited is silicon nitride;
   (b) said selected wavelength of light is 2537 angstroms; and
   (c) said film comprises polyvinylidene fluoride of 25 micrometers thickness.

4. In an apparatus for the photochemical deposition of a layer of a selected material on a substrate which comprises a reaction chamber with a quartz window integral with the top surface thereof, means for introducing a reactant gas mixture into said reaction chamber, means for heating said substrate in said chamber, means for producing radiation of a predetermined wavelength and introducing said radiation into said chamber through said quartz window, and means for producing a vacuum in said chamber, the improvement comprising:

(a) a film of predetermined material placed within said reaction chamber, said film being movable across the internal face of said quartz window within said reaction chamber, said predetermined material being transparent to said selected wavelength of radiation, stable at the elevated temperature required for said deposition, and possessing sufficient mechanical strength to be moved across said quartz window;

(b) means associated with said film for drawing said film across said internal face of said quartz window, whereby said film at said internal face of said quartz window during the deposition process prevents undesirable deposits of said selected material on said internal face and said drawing of said film across said internal face removes said selected material deposited on said film from close proximity to said internal face to thereby maintain said internal face of said window in a clean and transparent state and enhance the efficiency of said deposition.

5. A mobile transparent window apparatus in combination with a photochemical vapor deposition system having a reaction chamber with a quartz window integral with the top surface thereof, comprising:

(a) a roll of film of a predetermined material that is transparent to the selected wavelength of radiation used to initiate the desired photochemical reaction, is stable at the elevated temperature required for deposition, and has sufficient mechanical strength to be moved across the internal surface of said quartz window within said reaction chamber of said photochemical vapor deposition system;

(b) a feed roll at a position that corresponds to a first end of said quartz window, to hold said roll of film and to feed said film across said internal surface of said window;

(c) a take-up roll at a position that corresponds to a second end of said quartz window opposite said first end, to take up said film which has been moved across said internal surface of said window;

(d) a guide mechanism intermediate to said feed roll and said take-up roll and positioned to ultimately be in close proximity to said internal surface of said quartz window and to said first and said second ends of said quartz window, to cause said film to pass smoothly over said internal surface of said quartz window and with optimal spacing therewith, but with minimized friction; and (e) a shaft connected at one end to said take-up roll and at the opposite end to a motor that is external to said reaction chamber, said shaft passing through a rotary vacuum seal at the external surface of said reaction chamber, whereby, when said appratus is positioned in close proximity to said internal surface of said quartz window of said reaction chamber and said motor is activated, said motor rotates said shaft and said shaft rotates said take-up roll, to draw said film from said feed roll across said internal surface of said quartz window to thereby prevent undesirable deposits of photochemical reaction products on said quartz window and to remove said deposits on said film from close proximity to said internal surface of said quartz window and thus maintain said quartz window in a clean and transparent state and enhance the efficiency of said deposition.

6. A mobile transparent window apparatus for use in a photochemical vapor deposition system having a reaction chamber with a quartz window integral with the top surface thereof, comprising:

(a) a roll of film of a predetermined material that is transparent to the selected wavelength of radiation used to initiate the desired photochemical reaction, is stable at the elevated temperature required for deposition, and has sufficient mechanical strength to be moved across the internal surface of said quartz window within said reaction chamber;

(b) a feed roll at a position that corresponds to a first end of said quartz window, to hold said roll of film and to feed said film across said internal surface of said window;

(c) a take-up roll at a position that corresponds to a second end of said quartz window opposite said first end, to take up said film which has been moved across said internal surface of said window;

(d) a guide mechanism intermediate to said feed roll and said take-up roll and positioned to ultimately be in close proximity to said internal surface of said quartz window and to said first and second ends of said quartz window, to cause said film to pass smoothly over said internal surface of said quartz window and with optimal spacing therewith, but with minimized friction;

(e) a substrate holder attached at a first end by a first support plate to the shaft of said feed roll and to said guide mechanism adjacent said feed roll and attached at a second end by a second support plate to the shaft of said take-up roll and to said guide mechanism adjacent said take-up roll whereby the substrate on which said photochemical reaction products are to be deposited is placed on said substrate holder during said deposition; and (f) shaft means connected at one end thereof to said take-up roll and at the opposite end thereof to a motor that is external to said reaction chamber, said shaft means passing through a rotary vacuum seal at the external surface of said reaction chamber, whereby, when said apparatus is positioned in close proximity to said internal surface of said quartz window of said reaction chamber and said motor is activated, said motor rotates said shaft means and said shaft means rotates said take-up roll, to draw said film from said feed roll across said internal surface of said quartz window to thereby prevent undesirable deposits of photochemical reaction products on said quartz window and to remove said deposits on said film from close proximity to said internal surface of said quartz window and thus maintain said quartz window in a clean and transparent state and enhance the efficiency of said deposition.

7. A method for passing radiation to a predefined enclosed region for producing therein a vapor deposition reaction while simultaneously minimizing the resistance to the transmission of said radiation caused by extraneous deposits formed by said vapor deposition reaction, which method comprises the steps of:

(a) providing a chosen window material adjacent said region and suitable for passing radiation of a selected wavelength therethrough and into said enclosed region to produce said vapor deposition reaction within said region;

(b) providing a film of radiation-transmissive material adjacent said window and positioned between said window and said region and operative to collect said extraneous deposits formed by said vapor deposition reaction; and (c) providing continuous relative movement between said film and said window material, whereby said resistance to said transmission of said radiation caused by said extraneous deposits formed by said vapor deposition reaction, in the path of said radiation is continuously minimized and thereby in turn maximizes the vapor deposition rate and efficiency within said region.

8. A method for maximizing the radiation-induced rate of photochemical vapor deposition within an enclosed chamber which is sustaining said deposition, including:

(a) providing a radiation-transparent window and film on one wall of said chamber;

(b) passing radiation of a chosen wavelength through both said window and said film and into said chamber to induce a photochemical vapor deposition reaction therein, while simultaneously causing extraneous deposition of reaction products on said film; and (c) providing continuous relative movement between said window and said film to thereby minimize the resistance to the transmission of said radiation into said chamber caused by extraneous deposits of said reaction products and thus maximize the efficiency and rate of said vapor deposition reaction occuring therein.

9. A method as set forth in claim 8 wherein said radiation of said chosen wavelength is passed through predetermined portions of both said window and said film to strike predetermined portions of a target for said photochemical vapor deposition, positioned within said chamber, to thereby form a desired patterned layer of said reaction products on said target.

* * * * *